(12) United States Patent
Chang

(10) Patent No.: US 9,354,253 B2
(45) Date of Patent: May 31, 2016

(54) PROBE MODULE

(71) Applicant: MPI Corporation, Hsinchu County (TW)

(72) Inventor: Chia-Tai Chang, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 234 days.

(21) Appl. No.: 14/028,551

(22) Filed: Sep. 17, 2013

(65) Prior Publication Data

US 2014/0203834 A1 Jul. 24, 2014

(30) Foreign Application Priority Data

Jan. 21, 2013 (TW) .............................. 102102221 A

(51) Int. Cl.
| | | |
|---|---|---|
| G01R 31/00 | (2006.01) | |
| G01R 1/073 | (2006.01) | |
| H01L 21/00 | (2006.01) | |
| G01R 1/00 | (2006.01) | |

(52) U.S. Cl.
CPC .............. *G01R 1/07342* (2013.01); *G01R 1/00* (2013.01); *H01L 21/00* (2013.01); *H01L 2221/00* (2013.01)

(58) Field of Classification Search
CPC ....... H01L 21/00; H01L 2221/00; G01R 1/00
See application file for complete search history.

(56) References Cited

U.S. PATENT DOCUMENTS

| | | | | |
|---|---|---|---|---|
| 4,382,228 A | * | 5/1983 | Evans ................ | G01R 31/2886 324/72.5 |
| 5,477,159 A | * | 12/1995 | Hamling .................. | 324/755.02 |
| 5,818,249 A | * | 10/1998 | Momohara .............. | 324/756.03 |
| 5,953,306 A | * | 9/1999 | Yi .................................. | 369/126 |
| 5,969,533 A | | 10/1999 | Takagi | |
| 6,204,674 B1 | * | 3/2001 | Dabrowiecki ........... | G01R 3/00 324/750.25 |
| 6,333,635 B1 | * | 12/2001 | Lee ..................... | G01R 31/2886 324/754.07 |
| 6,351,133 B1 | * | 2/2002 | Jones et al. .............. | 324/756.04 |
| 8,324,923 B2 | | 12/2012 | Kister | |
| 2002/0052129 A1 | * | 5/2002 | Cabintos ............ | G01R 1/07357 439/70 |

FOREIGN PATENT DOCUMENTS

| | | |
|---|---|---|
| JP | 6-222079 | 8/1994 |
| JP | 1994-222079 | 8/1994 |
| JP | 06222079 A * | 8/1994 |
| JP | 1998-185955 | 7/1998 |
| TW | 200734649 A | 9/2007 |

* cited by examiner

*Primary Examiner* — Huy Q Phan
*Assistant Examiner* — Temilade Rhodes-Vivour
(74) *Attorney, Agent, or Firm* — CKC & Partners Co., Ltd.

(57) ABSTRACT

A probe module includes a substrate having a through hole, and at least four probe-needle rows arranged on the substrate. The probe-needle rows are arranged from a first side to a second side along a first direction. Each of the probe-needle rows has at least two needles arranged along a second direction. Each of the needles has a contact segment and an arm segment having an included angle with the contact segment. An end of the arm segment is connected to the substrate, and the other end of which extends toward the through hole to connect the contact segment. The lengths of the contact segments of the needles of each of the probe-needle rows are the same. The included angles of the needles of the probe-needle rows along the first direction are gradually increased from the first side to the second side.

20 Claims, 9 Drawing Sheets

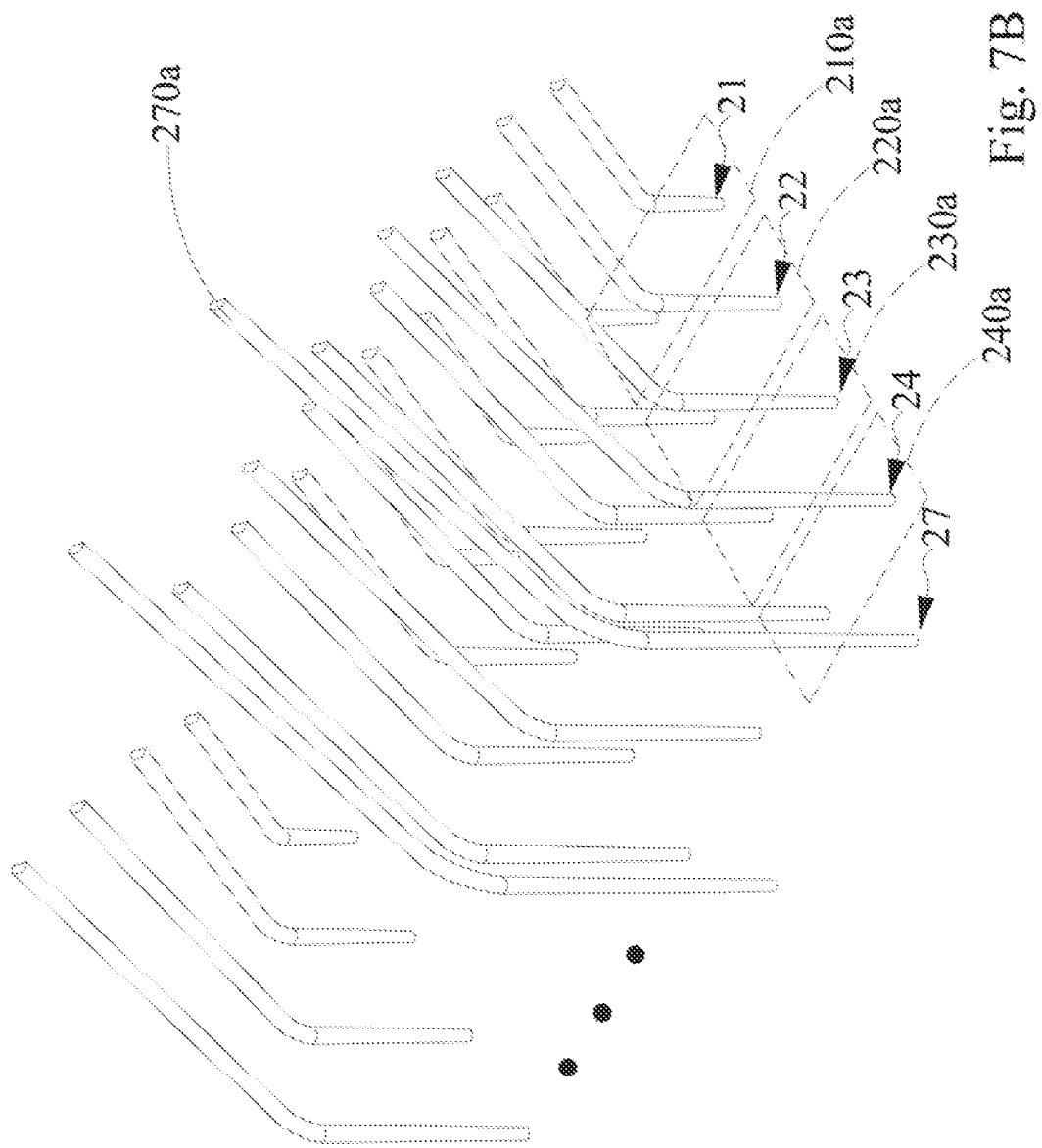

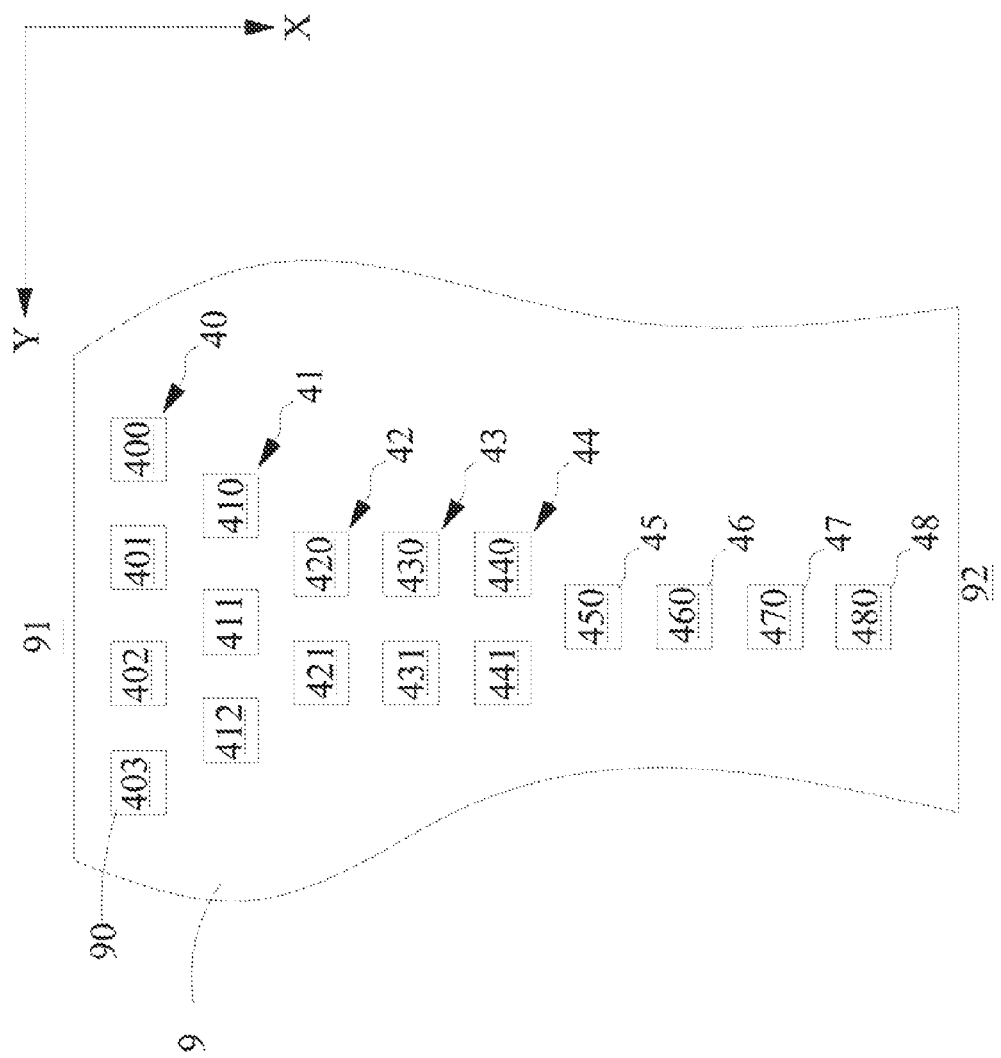

PROBE MODULE

RELATED APPLICATIONS

This application claims priority to Taiwan Application Serial Number 102102221, filed Jan. 21, 2013, which is herein incorporated by reference.

BACKGROUND

1. Technical Field

The present disclosure relates to a probe structure. More particularly, the present disclosure relates to a probe module having multi-tier needles with angle variation.

2. Description of Related Art

In a test of semiconductor chips, a tester needs to contact devices under test (DUT), such as chips, through probe cards. Test results of the devices under test can be obtained by signal transmissions and electrical signal analysis. A probe card often includes several precision needles arranged thereon. Each of the needles usually corresponds to a specific electrical connection pad of a chip (i.e. a device under test). When the needles contact the corresponding electrical connect (i.e., pads, bump, etc.), the test signals of the tester having the probe card can be correctly transmitted. Simultaneously, the control and analysis procedures of the tester and the probe card are operated in coordination to achieve the purpose of testing the electrical characteristics of the device under test.

However, along with the progress in electrical element, the density of the electrical concacts of the chip is gradually increased, such that the density and the tier number of the needles need to be increased as well. FIGS. 1A and 1B are structure schematic views of multi-tier needle structures of conventional probe modules. Referring to FIG. 1A, a chip 100 has two electrical concacts 100a, 100b thereon, and the probe module has a first probe-needle row and a second probe-needle row. The first probe-needle row has a plurality of needles (12-1, 12-2), and the second probe-needle row has a plurality of needles (12-3, 12-4). The end portions 12b of the needles are respectively connected to the electrical concacts 100a, 100b. An included angle is formed between the arm segment 12d and the contact segment 12e of each of the needles. As far as the needles at the same row are concerned, such as the second probe-needle row, the included angle θ1 of the needle 12-3 is smaller than the included angle θ2 of the needle 12-4. Moreover, in the first probe-needle row, the included angle θ1 of the needle 12-1 is smaller than the included angle θ2 of the needle 12-2. In addition, as far as the corresponding needles at different rows, the included angles of the needles are the same. For example, the needle 12-1 of the first probe-needle row and the needle 12-3 of the second probe-needle row have the same included angle θ1, and the needle 12-2 of the first probe-needle row and the needle 12-4 of the second probe-needle row have the same included angle θ2. Furthermore, in FIG. 1B, the included angles of the needles are the same, but the lengths of the contact segments of the needles are different.

SUMMARY

An aspect of the present invention is to provide a probe module having a multi-tier needle structure. Contact segments having a same length of needles of each of probe-needle rows and the corresponding needles having different bending angles of the different probe-needle rows are designed to proceed electrical tests to a chip having electrical concacts with high density and small pitches.

According to an embodiment of the present invention, a probe module includes a substrate and at least four probe-needle rows. The substrate has a through hole. The probe-needle rows are arranged on the substrate. The probe-needle rows are arranged from a first side to a second side along a first direction. Each of the probe-needle rows has at least two needles arranged along a second direction. Each of the needles has a contact segment and an arm segment. An end of the arm segment is connected to the substrate, and the other end of the arm segment extends toward the through hole to connect the contact segment. An included angle is formed between the contact segment and the arm segment. The lengths of the contact segments of the needles of each of the probe-needle rows are the same. The included angles of the needles of the probe-needle rows along the first direction are gradually increased from the first side to the second side.

According to another embodiment of the present invention, a probe module includes a substrate and at least four first probe-needle rows. The substrate has a through hole. The first probe-needle rows are arranged on the substrate. The first probe-needle rows are arranged from a first side to a second side along a first direction. Each of the first probe-needle rows has at least two needles arranged along a second direction. The numbers of the needles of at least two of the first probe-needle rows are different. Each of the needles has a contact segment and an arm segment. An end of the arm segment is connected to the substrate, and the other end of the arm segment extends toward the through hole to connect the contact segment. An included angle is formed between the contact segment and the arm segment. The lengths of the contact segments of the needles of each of the first probe-needle rows are the same. For the two adjacent first probe-needle rows, the included angle of the needle having the largest included angle of the first probe-needle row adjacent to the first side is smaller than or equal to the included angle of the needle having the smallest included angle of the first probe-needle row adjacent to the second side, such that the included angles of the needles of the first probe-needle rows along the second direction are gradually increased from the first side to the second side.

BRIEF DESCRIPTION OF THE DRAWINGS

FIGS. 7A and 7B are schematic views of a needle arrangement according to an embodiment of the present invention; and FIG. 8 is a schematic view of an asymmetric needle arrangement according to an embodiment of the present invention.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1B:
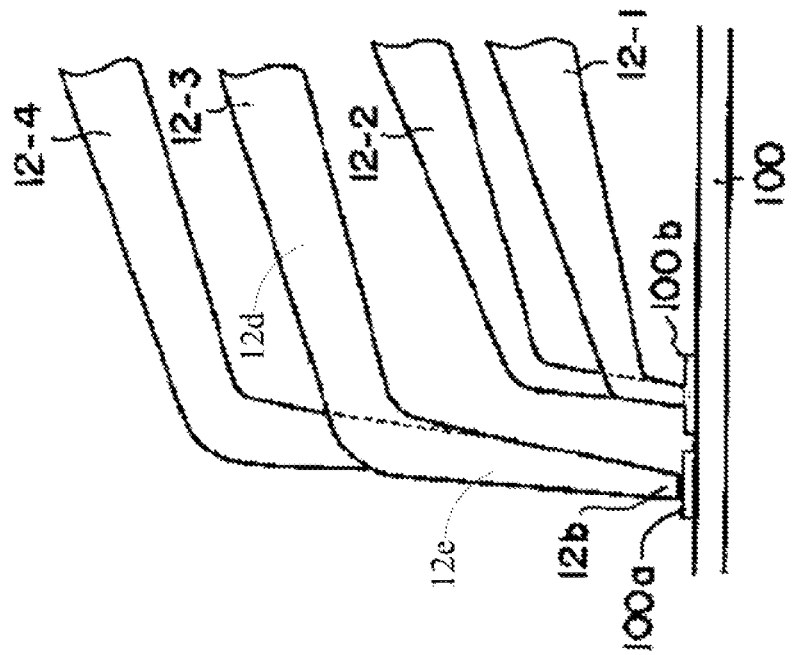
FIGS. 1A and 1B are structure schematic views of multi-tier needle structures of conventional probe modules.
Figure 1A:
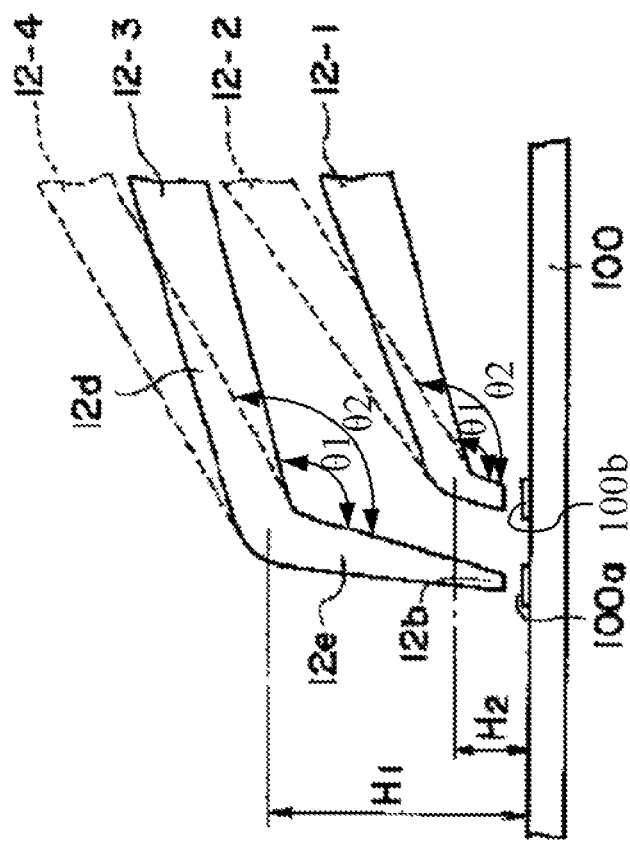
Figure 2:
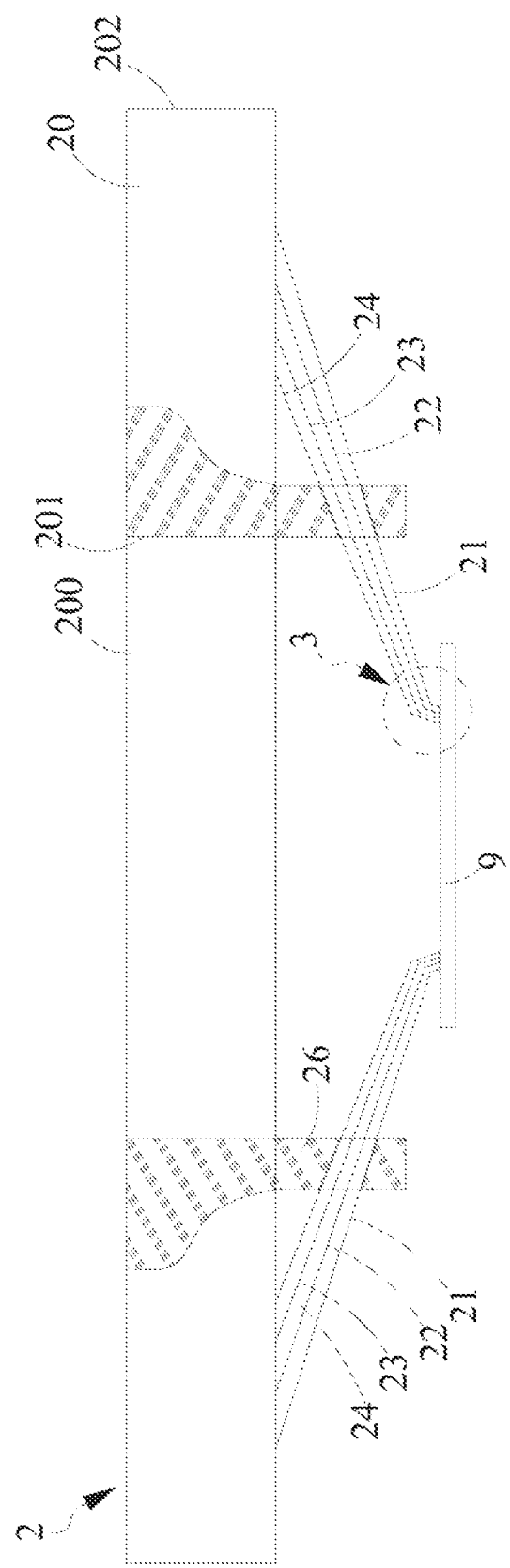
FIG. 2 is a side and partial cross-sectional view of a probe module according to an embodiment of the present invention.

FIG. 2 is a side and partial cross-sectional view of a probe module 2 according to an embodiment of the present invention. The probe module 2 includes a substrate 20 and at least four probe-needle rows 21-24 arranged on the substrate 20. The substrate 20 has a through hole 200 having an edge 201. The substrate 20 has an external structure 202. In this embodiment, the four probe-needle rows 21-24 are arranged between the edge 201 of the through hole 200 and the external structure 202 of the substrate 20, but the position of the probe-needle rows 21-24 is not limited in this regard. In order to strengthen the stability of the probe-needle rows 21-24, the substrate 20 further has a fixing member 26 to maintain the positions of the probe-needle rows 21-24. Moreover, the end portions of the needles at outside of the fixing member 26 may be soldered to the substrate 20 in accordance with the layout of the electrical concacts of the substrate 20, and the arrangement of the needles may be different from the arrangement shown in FIG. 2. Therefore, the positions of the substrate 20 connected to the end portions of the needles are determined in accordance with practical requirements, and the present invention is not limited to the embodiment shown in FIG. 2.

Figure 3:
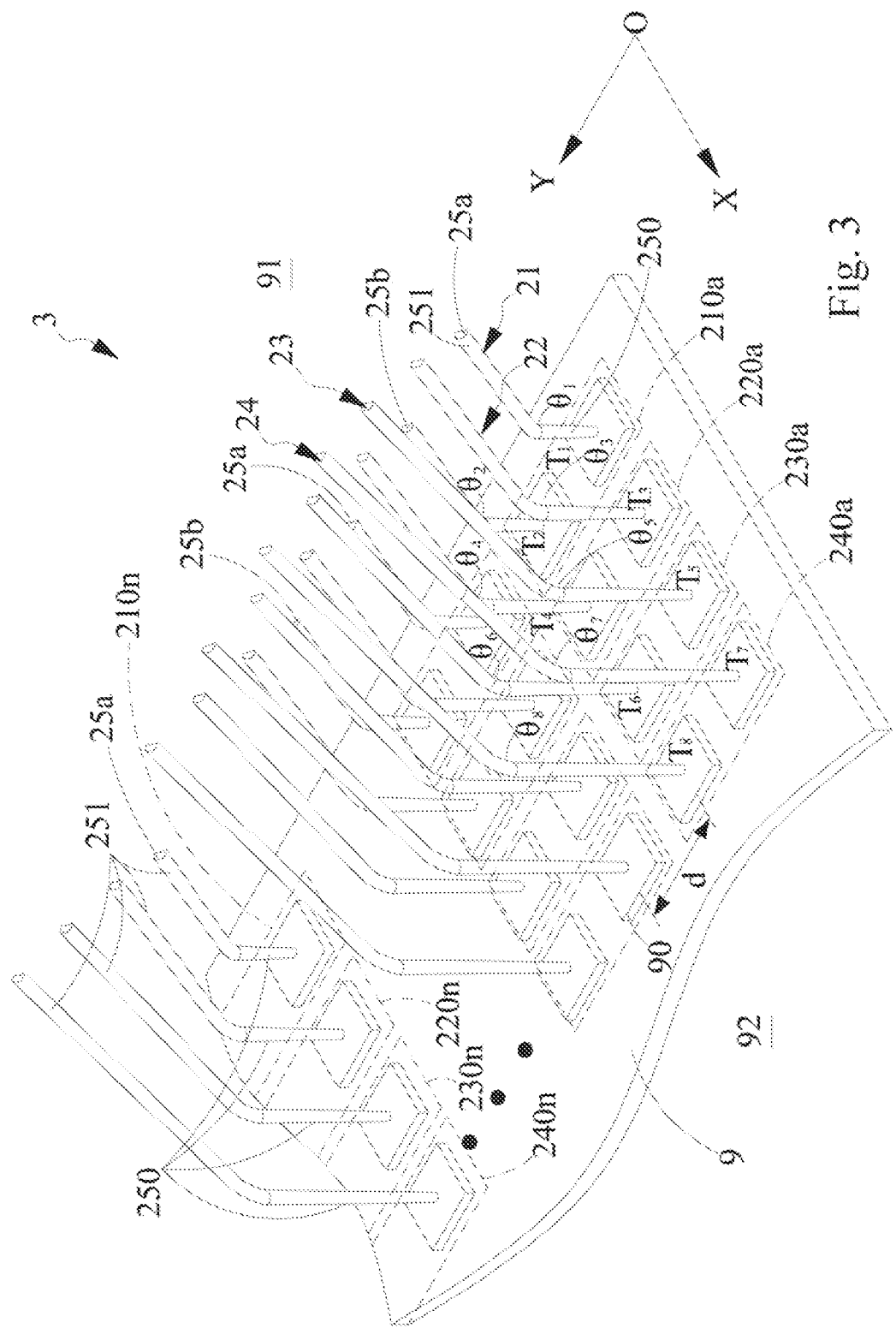
FIG. 3 is an enlarged perspective view of a partial region 3 shown in FIG. 2.

FIG. 3 is an enlarged perspective view of a partial region 3 shown in FIG. 2. The needles of the probe-needle rows 21-24 electrically contact the electrical concacts 90 of a to-be tested chip 9 to test the electrical characteristics of the to-be tested chip 9. As far as the electrical concacts 90 at the same row are concerned, a pitch d between the two adjacent electrical concacts 90 is smaller than or equal to 40 μm. In this embodiment, the probe-needle rows 21-24 are arranged from a first side 91 to a second side 92 along a first direction X. Each of the probe-needle rows 21-24 has at least two needles arranged along a second direction Y. At least two needles are defined as a needle group, and each of the probe-needle rows 21-24 has a plurality of needle groups. The aforesaid arrangement of the needles depends on the positions of the tips (i.e. contact segments 250) of the needles. The tip of the needle is referred to as a portion of the needle that is used to contact the electrical connection pad 90 of the to-be tested chip 9. In this embodiment, the first side 91 along the first direction X is adjacent to the external structure 202 of the substrate 20, and the second side 92 along the first direction X is adjacent to the edge 201 of the through hole 200. In this embodiment, the probe-needle rows 21-24 respectively have the needle groups 210a, 220a, 230a, 240a. The numbers of the needle groups 210a, 220a, 230a, 240a along the second direction Y are the same, and the needle groups 210a, 220a, 230a, 240a along the first direction X correspond to each other. For example, the probe-needle row 21 has the needle groups 210a-210n along the second direction Y; the probe-needle row 22 has the needle groups 220a-220n along the second direction Y; the probe-needle row 23 has the needle groups 230a-230n along the second direction Y; and the probe-needle row 24 has the needle groups 240a-240n along the second direction Y. Moreover, the needle groups 210a-210n, 220a-220n, 230a-230n, 240a-240n are respectively correspond to each other along the first direction X. For example, the needle groups 210a, 220a, 230a, 240a correspond to each other along the first direction X, and the other corresponding needle groups (e.g., 210n, 220n, 230n, 240n) have the same design.

Figure 4:
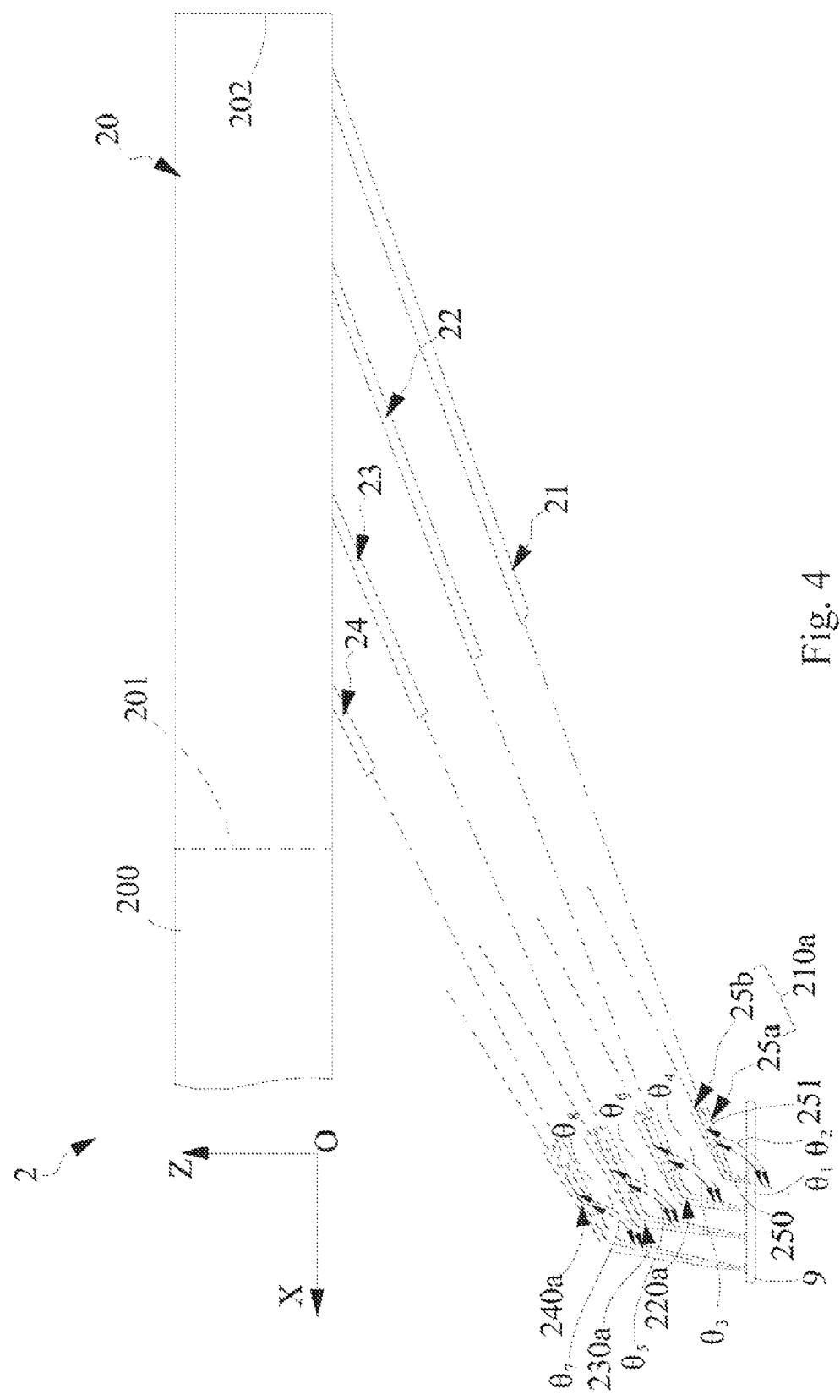
FIG. 4 is a schematic view of included angle relationships of needles of corresponding needle groups of probe-needle rows.
Figure 5B:
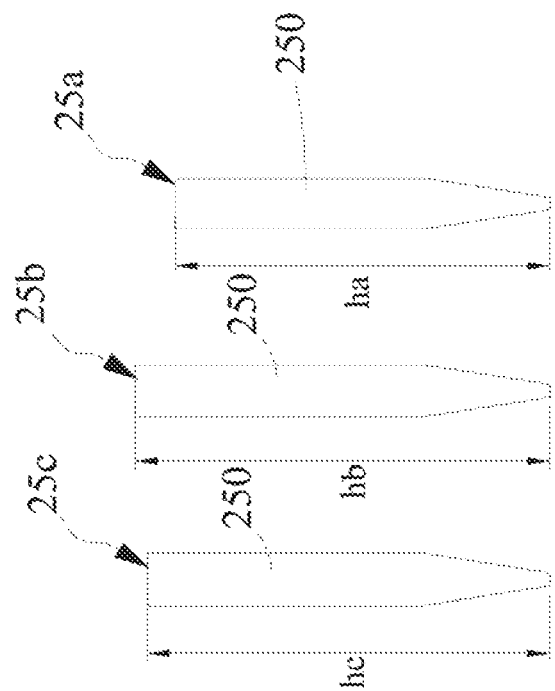
FIGS. 5A and 5B are length error schematic views of contact segments of the needles.
Figure 5A:
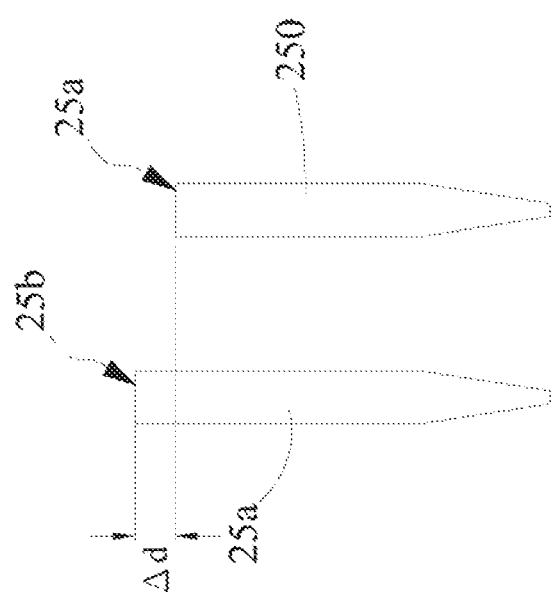

In this embodiment, each of the needle groups 210a, 220a, 230a, 240a includes a first needle 25a and a second needle 25b. The first needles 25a of the corresponding needle groups (210a-210n, 220a-220n, 230a-230n, 240a-240n) of the probe-needle rows 21-24 are aligned with and correspond to each other along the first direction X, and the second needles 25b of the corresponding needle groups (210a-210n, 220a-220n, 230a-230n, 240a-240n) of the probe-needle rows 21-24 are aligned with and correspond to each other along the first direction X. Referring to FIGS. 3 and 4, each of the first and second needles 25a, 25b has the contact segment 250 and an arm segment 251. An end of the arm segment 251 is connected to the substrate 20, and the other end of the arm segment 251 extends toward the through hole 200 to connect the contact segment 250. An included angle is formed between the contact segment 250 and the arm segment 251, and the lengths of the contact segments 250 of the first and second needles 25a, 25b of each of the probe-needle rows 21-24 are the same. For example, the lengths of the contact segments 250 of the first and second needles 25a, 25b of the probe-needle row 21 are the same, and the first and second needles 25a, 25b of the other probe-needle row (e.g., 22) have the same design. The aforesaid "same length" may have tolerance of height different. As shown in FIG. 5A, the two contact segments 250 of the first and second needles 25a, 25b of one of the needle groups have a height different Δd. The absolute value of the height different Δd is in a range from 0 to 1 mil (0.001 inch).

Referring back to FIGS. 3 and 4, in this embodiment, each of the needle groups (210a-210n, 220a-220n, 230a-230n, 240a-240n) has two needles, but in another embodiment, each of the needle groups may has more than three needles. As shown in FIG. 5B, one of the needle groups having three needles as an example, the three needles are the first, second, and third needle 25a, 25b, 25c. The absolute value of the height different of any two of the three needles is smaller or equal to 1 mil. For example:

$|ha-hb| \leq 1$ mil;

$|ha-hc| \leq 1$ mil; and $|hb-hc| \leq 1$ mil.

As shown in FIGS. 3 and 4, the included angle described in the present invention is defined between the central line of the contact segment 250 and the central line of the arm segment 251. In this embodiment, the distance between the two central lines of the two contact segments 250 of the two adjacent needles is smaller or equal to 40 μm.

The feature of the included angles between the contact segments 250 and the arm segments 251 of the needles is that the included angles of the corresponding first and second needles 25a, 25b of the corresponding needle groups (210a-210n, 220a-220n, 230a-230n, 240a-240n) of the probe-needle rows 21-24 along the first direction X are gradually increased from the side of the external structure 202 of the substrate 20 to the edge 201 of the through hole 200, such as the needle groups 210a, 220a, 230a, 240a shown in FIGS. 3 and 4. Referring to FIG. 4, each of the needle groups 210a, 220a, 230a, 240a of the probe-needle rows 21-24 has the first and second needles 25a, 25b. The positions of the first and second needles 25a, 25b of the needle groups 210a, 220a, 230a, 240a along the second direction Y correspond to each other. The first and second needles 25a, 25b of the needle group 210a respectively has the included angles $\theta_1$ and $\theta_2$, the first and second needles 25a, 25b of the needle group 220a respectively has the included angles $\theta_3$ and $\theta_4$, the first and second needles 25a, 25b of the needle group 230a respectively has the included angles $\theta_5$ and $\theta_6$, and the first and second needles 25a, 25b of the needle group 240a respectively has the included angles $\theta_7$ and $\theta_8$. In this embodiment, the included angle relationship of the corresponding first and second needles 25a, 25b of the needle groups 210a, 220a, 230a, 240a is $\theta_1<\theta_2<\theta_3<\theta_4<\theta_5<\theta_6<\theta_7<\theta_8$. Therefore, the included angles are gradually increased from the side of the external structure 202 of the substrate 20 to the edge 201 of the through hole 200. That is to say, the included angle $\theta_3$ of the needle having the smallest included angle of the second probe-needle row is greater than the included angle $\theta_2$ of the needle having the largest included angle of the first probe-needle row, and the other included angles have the same arrangement (e.g., the included angle $\theta_5$ is greater than the included angle $\theta_4$). In addition, as shown in FIG. 3, the first and second needles 25a, 25b of the needle group 210a respectively have the contact segment lengths $T_1$, $T_2$, the first and second needles 25a, 25b of the needle group 220a respectively have the contact segment lengths $T_3$, $T_4$, the first and second needles 25a, 25b of the needle group 230a respectively have the contact segment lengths $T_5$, $T_6$, and the first and second needles 25a, 25b of the needle group 240a respectively have the contact segment lengths T7, T8. The relationship of the contact segment lengths is $T_7=T_8>T_5=T_6>T_5=T_3>T_4>T_1=T_2$. As shown in FIGS. 3 and 4, in this embodiment, the probe-needle rows 21-24 have a first probe-needle row and a second probe-needle row, and the first probe-needle row is adjacent to the second probe-needle row. The contact segments of the needles of the second probe-needle row is larger than the contact segments of the needles of the first probe-needle row. For example, the first probe-needle row is the probe-needle row 21, the second probe-needle row is the probe-needle row 22, and the contact segment lengths $T_3$, $T_4$ of the probe-needle row 22 are greater than the contact segment lengths $T_1$, $T_2$ of the probe-needle row 21. In this embodiment, the number of the needles of the second probe-needle row 22 is not equal to the number of the needles of the first probe-needle row 21.

Furthermore, in this embodiment, the included angles of the first needles 25a of the corresponding needle groups (210a-210n, 220a-220n, 230a-230n, 240a-240n) of the probe-needle rows 21-24 are smaller than the included angles of the second needles 25b. The absolute value of the angle difference between the included angles of the first and second needles 25a, 25b of each of the needle groups of the probe-needle row adjacent to the edge 201 of the through hole 200 is greater than or equal to 2 degrees. As shown in FIG. 3 and FIG. 4, in this embodiment, the probe-needle row 24 is adjacent to the edge 201 of the through hole 200, and the absolute value of the angle difference between the included angle $\theta_7$ of the first needle 25a and the included angle $\theta_8$ of the second needle 25b of each of the needle groups 240a-240n of the probe-needle row 24 is $|\theta_8-\theta_7|\geq 2°$.

The angle difference between the included angles of the first and second needles 25a, 25b of each of the needle groups of the probe-needle row adjacent to the edge 201 of the through hole 200 is greater than or equal to the included angles of the first and second needles 25a, 25b of the corresponding needle group of the probe-needle row adjacent to the external structure 202 of the substrate 20. As shown in FIG. 3 and FIG. 4, in this embodiment, the probe-needle row 24 is adjacent to the edge 201 of the through hole 200, and the absolute value of the angle difference between the included angle $\theta_7$ of the first needle 25a and the included angle $\theta_8$ of the second needle 25b of each of the needle groups 240a-240n of the probe-needle row 24 is greater than or equal to the absolute value of the angle difference between the included angle $\theta_1$ of the first needle 25a and the included angle $\theta_2$ of the second needle 25b of the corresponding needle groups 240a-240n of the probe-needle row 21 adjacent to the external structure 202 of the substrate 20. That is to say, $|\theta_8-\theta_7|\geq|\theta_2-\theta_1|$.

Moreover, another feature of the included angles of the needles of the present invention is that the angle difference between the included angle of the first needle of each of the needle groups of the probe-needle row adjacent to the edge 201 of the through hole 200 and the included angle of the second needle of the corresponding needle group of the adjacent probe-needle row is greater than or equal to 1 degree. As shown in FIG. 3 and FIG. 4, in this embodiment, the probe-needle row 24 is adjacent to the edge 201 of the through hole 200. For example, the absolute value of the angle difference between the included angle $\theta_7$ of the first needle 25a of the needle group 240a of the probe-needle row 24 and the included angle $\theta_6$ of the second needle 25b of the corresponding needle group 230a of the probe-needle row 23 adjacent to the probe-needle row 24 is greater than or equal to 1 degree. That is to say, $|\theta_7-\theta_6|\geq 1°$.

In this embodiment, based on the aforesaid feature of the angle difference, the absolute value of the angle difference between the included angle of the first needle of each of the needle groups of the probe-needle row adjacent to the edge 201 of the through hole 200 and the included angle of the second needle of the corresponding needle group of the adjacent probe-needle row is greater than or equal to the absolute value of the angle difference between the included angle of the second needle of the corresponding needle group of the probe-needle row adjacent to the external structure 202 of the substrate 20 and the included angle of the first needle of the corresponding needle group of the adjacent probe-needle row. As shown in FIG. 3 and FIG. 4, in this embodiment, the probe-needle row 24 is adjacent to the edge 201 of the through hole 200. For example, the absolute value of the angle difference between the included angle $\theta_7$ of the first needle 25a of the needle group 240a of the probe-needle row 24 and the included angle $\theta_6$ of the second needle 25b of the corresponding needle group 230a of the probe-needle row 23 adjacent to the probe-needle row 24 is $|\theta_7-\theta_6|$. The absolute value of the angle difference between the included angle $\theta_2$ of the second needle 25b of the corresponding needle group 210a of the probe-needle row 21 adjacent to the external structure 202 of the substrate 20 and the included angle $\theta_3$ of the first needle 25a of the corresponding needle group 220a of the probe-needle row 22 adjacent to the probe-needle row 21 is $|\theta_3-\theta_2|$. Further, $|\theta_7-\theta_6|\geq|\theta_3-\theta_2|$.

The arrangement of the included angle symbols $\theta_n$ of the needles having the aforesaid relationships will be explained in the following description. Referring to FIGS. 3 and 4, the included angle symbols are provided from the needle groups adjacent to the external structure 202 of the substrate 20. The included angles symbols are provided to the needles in sequence from the original point O along the second direction Y. After the included angle symbols are provided to the needles of the needle group along the second direction Y, the included angle symbols are provided to the next needle group along the first direction X. Thereafter, the included angle symbols are provided to the needles of the needle group along the second direction Y. As a result, the included angle symbols $\theta_1$-$\theta_n$ can be completely provided to the needles of all the corresponding the needle groups. The aforesaid angle feature can obtain the following relationships:

$$\theta_1<\theta_3<\ldots\theta_{n-3}<\theta_{n-1}$$

$$\theta_2<\theta_4<\ldots\theta_{n-2}<\theta_n$$

$$|\theta_n-\theta_{n-1}|\geq 2°$$

$|\theta_{n-1}-\theta_{n-2}|\geq 1°$ $|\theta_2-\theta_1|\geq|\theta_n-\theta_{n-1}|$ $|\theta_3-\theta_2|\geq|\theta_{n-1}-\theta_{n-2}|$ The number of the probe-needle rows 21-24 shown in aforementioned FIGS. 2-4 is four, but the present invention is not limited in this regard. Four or more than four probe-needle rows can also be suitable for the aforesaid included angle relationships. In addition, the number of the aforesaid needles of each of the needle groups is two, but the present invention is not limited in this regard. Two or more than two needles can also be suitable for the aforesaid included angle relationships.

For example, regarding to the number of the probe-needle rows is m (m≤9), and the number of each of the needle groups is a (in this embodiment, a=2). According to the aforesaid features, for matrix type needles, the included angle relationships of the corresponding needles of the needle groups can be obtained as the following relationships (1)-(3):

$$\theta_{1a}<\theta_{2a}\ldots<\theta_{(m_{max}-1)a}<\theta_{m_{max}a} \quad (1)$$

$$\theta_{11}<\theta_{21}\ldots<\theta_{(m_{max}-1)1}<\theta_{m_{max}1} \quad (2)$$

$$\theta_{12}<\theta_{22}\ldots<\theta_{(m_{max}-1)2}<\theta_{m_{max}2} \quad (3)$$

Wherein n=F(m, a), m is the number of the probe-needle rows, m≤9, a is the serial number of the needle of the needle groups of each of the probe-needle rows, and 1≤a. The aforesaid relationship (1) means that the included angles of the needles corresponding to the same needle group and serial number along the first direction are gradually increased. In the embodiment shown in FIGS. 2-4, a may be 1 or 2, such that the relationship (1) can be replaced by the relationships (2), (3). In another embodiment, the range of the maximum $m_{max}$ of the row number m is 4≤m≤9. Other relationships can be obtained as the following relationships:

$$|\theta_{m(a+1)}-\theta_{ma}|\geq 2° \text{ and } (a+1)\leq a_{max} \quad (4)$$

$$|\theta_{(m+1)1}-\theta_{ma_{max}}|\geq 1° \quad (5)$$

Wherein $a_{max}$ is the maximum of the serial numbers of each of the needle groups. The relationship (4) means that: regarding to the needles of the same probe-needle row, the absolute value of the angle difference between the two included angles of the two adjacent needles is greater than or equal to 2 degrees, and the limitation of the relationship (4) is $(a+1)\leq a_{max}$. The relationship (5) means that: regarding to the two adjacent probe-needle rows, the absolute value of the angle difference between the included angle of the needle having the smallest included angle of the probe-needle row (m+1) adjacent to the second side along the first direction and the included angle of the needle having the largest included angle of the probe-needle row m adjacent to the first side along the first direction is greater than or equal to 1 degree. Other relationships can be obtained as the following relationships:

$$(|\theta_{m(a+1)}-\theta_{ma}|\geq|\theta_{m_{max}(a+1)}-\theta_{m_{max}a}|) \text{ and } (a+1)\leq a_{max} \text{ and } m<m_{max} \quad (6)$$

$$(|\theta_{12}-\theta_{11}|\geq|\theta_{m_{max}2}-\theta_{m_{max}1}|) \quad (7)$$

The relationship (6) means that: regarding to the needles of the same probe-needle row (m<$m_{max}$), the absolute value of the angle difference between the two included angles of the two adjacent needles (a+1 and a) is smaller than or equal to the absolute value of the angle difference between the two included angles of the two corresponding needles (a+1 and a) of the probe-needle row $m_{max}$. In the relationship (6), if m=1, a=1, the relationship (6) can be replaced by the relationship (7). Other relationships can be obtained as the following relationships:

$$(|\theta_{(m+1)1}-\theta_{ma_{max}}|\geq|\theta_{m_{max}1}-\theta_{(m_{max}-1)a_{max}}|) \text{ and } (m+1)<m_{max} \quad (8)$$

$$(|\theta_{21}-\theta_{12}|\geq|\theta_{m_{max}1}-\theta_{m_{max}-1)2}|) \quad (9)$$

The relationship (8) means that: regarding to the two adjacent probe-needle rows (m and m+1 and m+1<$m_{max}$), the absolute value of the angle difference between the included angle of the needle having the smallest included angle of the probe-needle row (m+1) adjacent to the second side along the first direction and the included angle of the needle having the largest included angle of the probe-needle row (m) adjacent to the first side along the first direction is smaller than or equal to the absolute value of the angle difference between the included angle of the needle having the smallest included angle of the terminal probe-needle row ($m_{max}$) along the first direction and the included angle of the needle having the largest included angle of the probe-needle row ($m_{max}-1$) front of the terminal probe-needle row long the first direction. In the relationship (8), if m=1, a=1, the relationship (8) can be replaced by the relationship (9).

Figure 6:
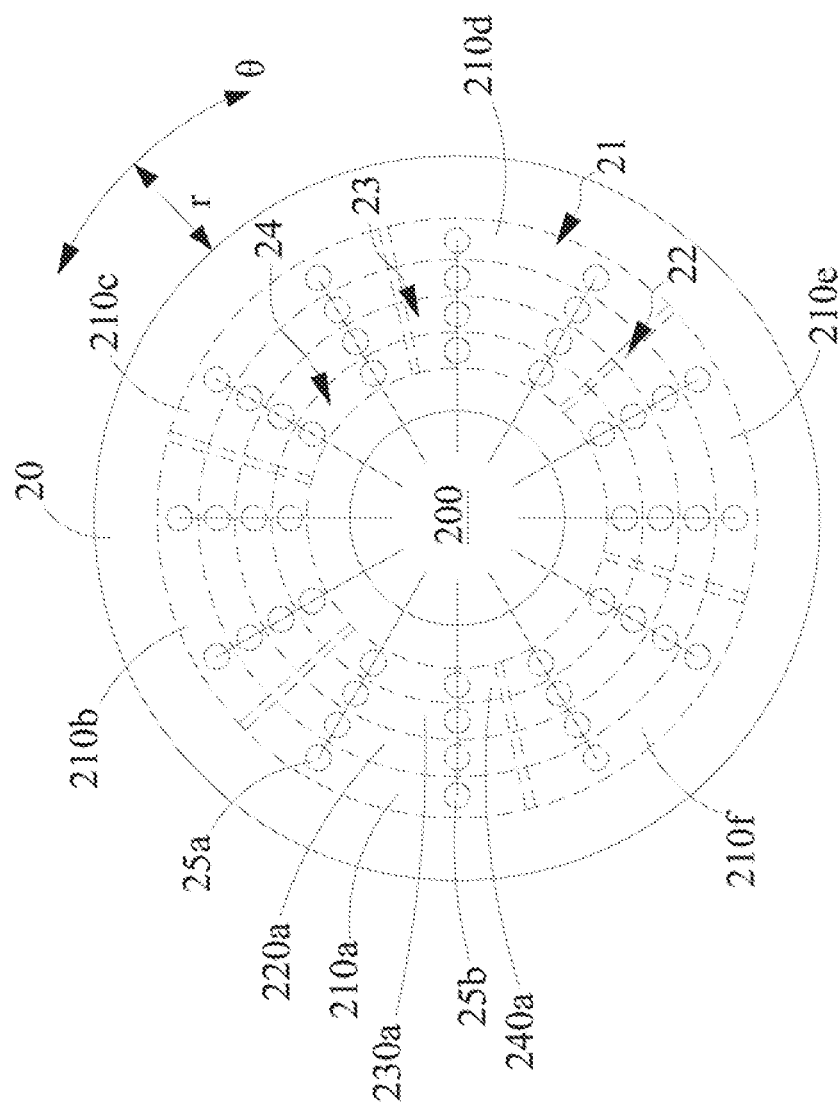
FIG. 6 is a schematic view of a needle arrangement according to an embodiment of the present invention.

In addition, the first and second directions shown in FIG. 3 are not limited to the two perpendicular directions X, Y at the same plane. In another embodiment, FIG. 6 is a schematic view of a needle arrangement according to an embodiment of the present invention. The needle arrangement in this embodiment is that the first direction is an arc direction (θ), and the second direction is a radial direction (r). The coordinate system defined by such arc direction (θ) and radial direction (r) is shown in FIG. 6. The probe module has four probe-needle rows 21-24, and each of the probe-needle rows 21-24 has a plurality of needle groups 210a-210f. Regarding to the probe-needle rows 21-24, the probe-needle rows 21-24 respectively have the corresponding needle groups 210a, 220a, 230a, 240a, and respectively have the corresponding first and second needles 25a, 25b. The relationships of the included angles of the needles are similar to the aforesaid embodiment, and the relationships of the included angles in this embodiment will not be described repeatedly.

Figure 7A:
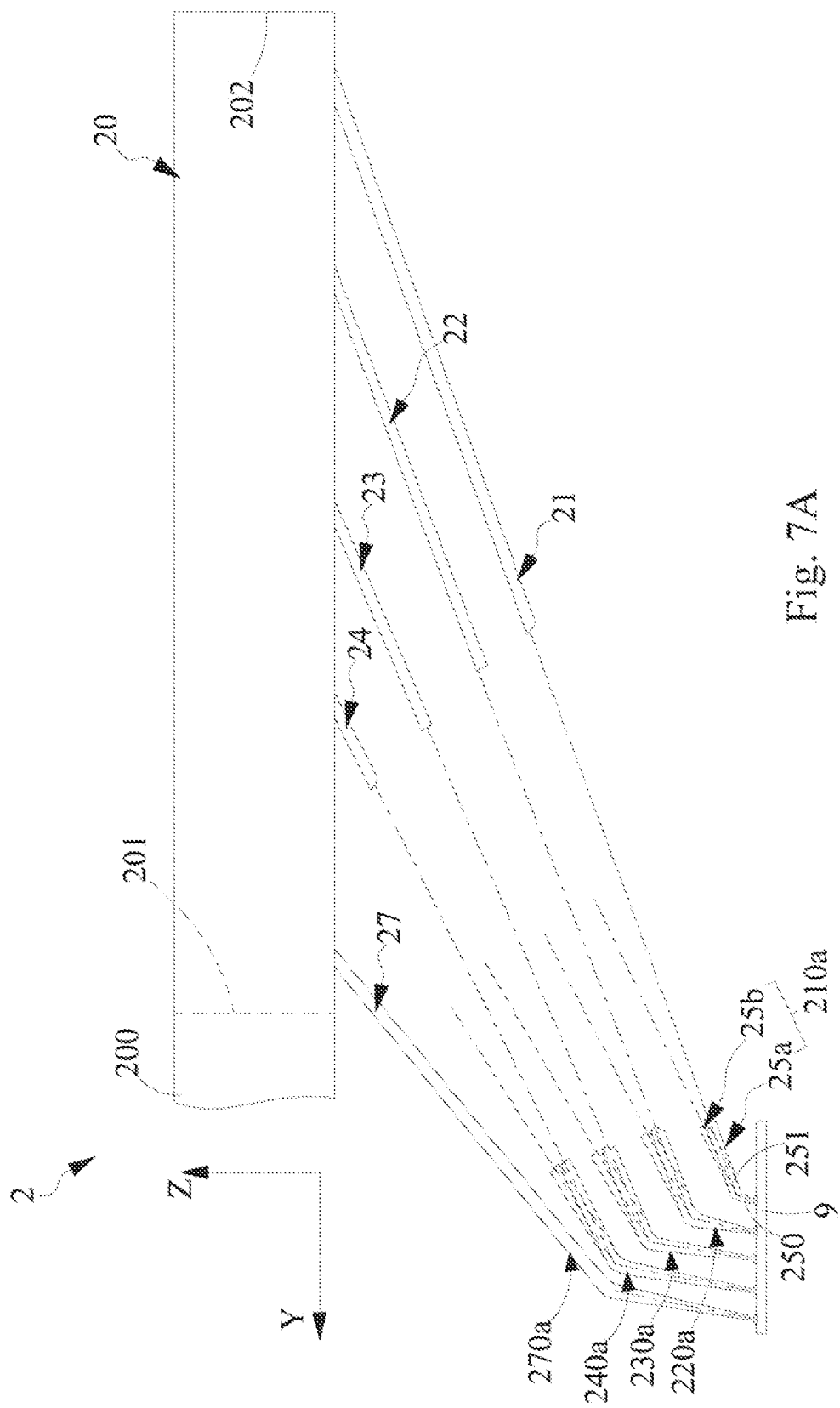

FIGS. 7A and 7B are schematic views of a needle arrangement according to an embodiment of the present invention. The structure of the needle arrangement is substantially similar to the embodiment shown in FIGS. 2-4. The difference between this embodiment and the embodiment shown in FIGS. 2-4 is that the probe module further has a probe-needle row 27. The probe-needle row 27 is arranged between the edge 201 of the through hole 200 and the probe-needle row 24 adjacent to the edge 201 of the through hole 200. The probe-needle row 27 has a plurality of needles 270a, and each of the needles 270a corresponds to one of the needle groups. Moreover, the needle groups (e.g., the needle groups 210a-240a) of the original probe-needle rows 21-24 correspond to each other, and an important feature in another embodiment is that a single needle 270a is increased to correspond to the needle groups 210a-240a. That is to say, according to the structure shown in FIGS. 2-4, the single needle 270a can be increased to correspond to the corresponding needle groups. The aforesaid feature of the single needle corresponding to the needle groups can be applied to the arrangement of the needles in the design of the arc direction (θ) and the radial direction (r) shown in FIG. 6.

FIG. 8 is a schematic view of an asymmetric needle arrangement according to an embodiment of the present invention. The asymmetric needle arrangement means that the numbers of the needles of the probe-needle rows are different, or means that the combination of a portion of the probe-needle rows having the same number of the needles and the other probe-needle rows having the different numbers of the needles. In this embodiment, the rectangular symbols shown in FIG. 8 means that the positions of the electrical concacts 90 of the to-be tested chip 9 for correspondingly contacting the contact segments of the needles.

In another embodiment, the probe module has nine probe-needle rows 40-48 arranged along the first direction X. Each of the probe-needle rows 40-44 has a plurality of needles arranged along the second direction Y. Each of the probe-needle rows 45-48 has one needle. The probe-needle row 40 has the needles 400-403, the probe-needle row 41 has the needles 410-412, the probe-needle row 42 has the needles 420-421, the probe-needle row 43 has the needles 430-431, and the probe-needle row 44 has the needles 440-441. The structure of the aforesaid needle is the same as the structure of the needle shown in FIG. 4. An included angle is formed between the arm segment and the contact segment of each of the needles. According the purpose of the present invention, the included angles of the needles of the probe-needle rows along the first direction X are gradually increased from the first side 91 to the second side 92.

In this embodiment, each of the needles 400-403 has the same contact segment length L0 and the needles 400-403 respectively have the included angles $\theta_{400}$, $\theta_{401}$, $\theta_{402}$, $\theta_{403}$. Each of the needles 410-412 has the same contact segment length L1, and the needles 410-412 respectively have the included angles $\theta_{410}$, $\theta_{411}$, $\theta_{412}$. Each of the needles 420-421 has the same contact segment length L2, and the needles 420-421 respectively have the included angles $\theta_{420}$, $\theta_{421}$. Each of the needles 430-431 has the same contact segment length L3, and the needles 430-431 respectively have the included angles $\theta_{430}$, $\theta_{431}$. The probe-needle row 44 has the needles 440-441 having the same contact segment length L4, and the needles 440-441 respectively have the included angles $\theta_{440}$, $\theta_{441}$. Furthermore, the needles 450, 460, 470, 480 respectively have the contact segment lengths L5-L8, and the needles 450-480 respectively have the included angles $\theta_{450}$, $\theta_{460}$, $\theta_{470}$, $\theta_{480}$. The relationship of the contact segment lengths is L1<L2<L3<L4<L5<L6<L7<L8. The relationships of the included angles can be described in two parts. The relationships of the included angles along the second direction Y are:

$\theta_{400} < \theta_{401} < \theta_{402} < \theta_{403}$;

$\theta_{410} < \theta_{411} < \theta_{412}$;

$\theta_{420} < \theta_{421}$;

$\theta_{430} \times \theta_{431}$; and $\theta_{440} < \theta_{441}$.

The aforesaid relationships means that the included angles of the needles arranged along the second direction Y of the probe-needle rows 40-44 are gradually increased from the first side to the second side in the second direction Y. In another embodiment, regarding to the probe-needle row 40, the first side of the second direction Y is a side of the needle 400, and the second side of the second direction Y is a side of the needle 403. However, the present invention is not limited in this regard. For example, the first side of the second direction Y may be a side of the needle 403, and the second side of the second direction Y may be a side of the needle 400.

In addition, in the two different and adjacent probe-needle rows, since the included angles along the first direction X are gradually increased, the included angle of the needle having the smallest included angle of the probe-needle row adjacent to the second side 92 of the first direction X is greater than the included angle of the needle having the largest included angle of the other probe-needle row adjacent to the first side 91 of the first direction X. The angle difference between the two included angles is greater or equal to 1 degree. The aforesaid angle difference will be described as the "adjacent probe-needle row angle difference" in the following description. Moreover, any one of the aforesaid adjacent probe-needle row angle difference (not the last two probe-needle rows adjacent to the second side) is smaller than or equal to the adjacent probe-needle row angle difference of the last two probe-needle rows adjacent to the second side 92. Therefore, the angle relationships of FIG. 8 are:

$\theta_{410} - \theta_{403} \geq 1°$;

$\theta_{420} - \theta_{412} \geq 1°$;

$\theta_{430} - \theta_{421} \geq 1°$;

$\theta_{440} - \theta_{431} \geq 1°$;

$\theta_{450} - \theta_{441} \geq 1°$;

$\theta_{460} - \theta_{450} \geq 1°$;

$\theta_{470} - \theta_{460} \geq 1°$;

$\theta_{480} - \theta_{470} \geq 1°$; and $\theta_{410} - \theta_{403} \geq \theta_{480} - \theta_{470}$.

Although the last are relationship $\theta_{410} - \theta_{403} \geq \theta_{480} - \theta_{470}$ is the comparison between the probe-needle rows 40, 41 and the probe-needle rows 47, 48, the adjacent probe-needle row angle difference of any two of the adjacent probe-needle rows 42-46 is smaller than or equal to $\theta_{480} - \theta_{470}$.

Furthermore, for the different needles of one of the probe-needle rows, the absolute value of the angle difference between the two included angles of the two adjacent needles is also greater than or equal to 2 degrees. Taking the first probe-needle row 40 as an example, the angle relationships are:

$\theta_{401} - \theta_{400} \geq 2$;

$\theta_{402} - \theta_{401} \geq 2$; and $\theta_{403} - \theta_{402} \geq 2$;

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A probe module comprising:
a substrate having a through hole; and
at least four probe-needle rows arranged on the substrate and from a first side to a second side along a first direction, each of the probe-needle rows having at least two needles arranged along a second direction, wherein each of the needles has a contact segment and an arm segment, an end of the arm segment is connected to the substrate, and the other end of the arm segment extends toward the through hole to connect the contact segment, an included angle is formed between the contact segment and the arm segment, lengths of the contact segments of the needles of each of the probe-needle rows are the same; the included angles of the needles of the probe-needle rows along the first direction are gradually increased from the first side to the second side, and the included angles of the needles of one of the probe-needle rows adjacent to the second side are greater than the included angles of the needles of another one of the probe-needle rows adjacent to the first side.

2. The probe module of claim 1, wherein the needles of each of the probe-needle rows along the second direction are aligned with each other.

3. The probe module of claim 1, wherein each of the probe-needle rows has a first needle and a second needle, the included angle of the first needle is smaller than the included angle of the second needle, the first needle is adjacent to the second needle, and an absolute value of an angle difference between the included angle of the first needle and the included angle of the second needle is greater than or equal to 2 degrees.

4. The probe module of claim 1, wherein the at least two needles are defined as a needle group, and each of the probe-needle rows has a plurality of needle groups.

5. The probe module of claim 4, wherein the at least four probe-needle rows have a first probe-needle row and a second probe-needle row, the first probe-needle row is adjacent to the second probe-needle row, and the contact segments of the needles of the second probe-needle row is larger than the contact segments of the needles of the first probe-needle row.

6. The probe module of claim 5, wherein the included angle of the needle having the smallest included angle of the second probe-needle row is greater than the included angle of the needle having the largest included angle of the first probe-needle row.

7. The probe module of claim 6, wherein an absolute value of an angle difference between the included angle of the needle having the smallest included angle of the second probe-needle row and the included angle of the needle having the largest included angle of the first probe-needle row is greater than or equal to 1 degree.

8. The probe module of claim 5, wherein the number of the needles of the second probe-needle row is not equal to the number of the needles of the first probe-needle row.

9. The probe module of claim 1, wherein a distance between two central lines of the two contact segments of the two adjacent needles is smaller or equal to 40 μm.

10. The probe module of claim 1, wherein errors of the contact segments having the same length are in a range from 0 to 1 mil.

11. The probe module of claim 4, further comprising:
a fifth probe-needle row arranged between an edge of the through hole and the probe-needle row adjacent to the edge of the through hole, wherein the fifth probe-needle row has a plurality of third needles, and each of the third needles corresponds to one of the needle groups.

12. The probe module of claim 1, wherein the number of the probe-needle rows is smaller than or equal to 9.

13. The probe module of claim 3, wherein an absolute value of an angle difference between the included angle of the first needle of the probe-needle row adjacent to the second side and the included angle of the second needle adjacent to the first needle is greater than or equal to an absolute value of an angle difference between the included angle of the first needle of the probe-needle row adjacent to the first side and the included angle of the second needle adjacent to the first needle.

14. The probe module of claim 1, wherein an absolute value of an angle difference between the included angle of the needle having the smallest included angle of the probe-needle row adjacent to the second side along the first direction and the included angle of the needle having the largest included angle of the probe-needle row adjacent to the first side along the first direction is smaller than or equal to an absolute value of an angle difference between the included angle of the needle having the smallest included angle of the terminal probe-needle row along the first direction and the included angle of the needle having the largest included angle of the probe-needle row front of the terminal probe-needle row along the first direction.

15. A probe module comprising:
a substrate having a through hole; and
at least four first probe-needle rows arranged on the substrate, wherein the first probe-needle rows are arranged from a first side to a second side along a first direction, each of the first probe-needle rows has at least two needles arranged along a second direction, the numbers of the needles of at least two of the first probe-needle rows are different, each of the needles has a contact segment and an arm segment, an end of the arm segment is connected to the substrate, and the other end of the arm segment extends toward the through hole to connect the contact segment, an included angle is formed between the contact segment and the arm segment, lengths of the contact segments of the needles of each of the first probe-needle rows are the same; for the two adjacent first probe-needle rows, the included angle of the needle having the largest included angle of the first probe-needle row adjacent to the first side is smaller than the included angle of the needle having the smallest included angle of the first probe-needle row adjacent to the second side.

16. The probe module of claim 15, wherein the included angles of the needles arranged along the second direction of the first probe-needle rows are gradually increased from the first side to the second side.

17. The probe module of claim 15, where an absolute value of an angle difference between the included angles of the two adjacent needles of each of the first probe-needle rows is greater than or equal to 2 degrees.

18. The probe module of claim 15, wherein an absolute value of an angle difference between the included angle of the needle having the largest included angle of the first probe-needle row adjacent to the first side and the included angle of the needle having the smallest included angle of the first probe-needle row adjacent to the second side is greater than or equal to 1 degree.

19. The probe module of claim 15, further comprising:
at least one second probe-needle row having a needle and adjacent to one of the first probe-needle rows, wherein an absolute value of an angle difference between the included angle of the needle having the largest included angle of the first probe-needle row adjacent to the first side and the included angle of the needle of the second probe-needle row adjacent to the second side is greater than or equal to 1 degree.

20. The probe module of claim 19, wherein the number of the second probe-needle row is two or greater; along the first direction, the included angle of the needle adjacent to the first side of one of the two adjacent second probe-needle rows is smaller than the included angle of the needle adjacent to the second side of the other second probe-needle row.

* * * * *